US006548849B1

(12) United States Patent
Pan et al.

(10) Patent No.: US 6,548,849 B1
(45) Date of Patent: Apr. 15, 2003

(54) MAGNETIC YOKE STRUCTURES IN MRAM DEVICES TO REDUCE PROGRAMMING POWER CONSUMPTION AND A METHOD TO MAKE THE SAME

(75) Inventors: Wei Pan, Vancouver, WA (US); Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 10/061,974

(22) Filed: Jan. 31, 2002

(51) Int. Cl.[7] .................. H01L 27/108; H01L 29/76; H01L 29/94; H01L 31/119
(52) U.S. Cl. .................. 257/296; 257/421
(58) Field of Search .................. 257/9, 288, 296, 257/295, 421, 422, 423, 427

(56) References Cited

U.S. PATENT DOCUMENTS 5,640,343 A * 6/1997 Gallagher et al. .......... 365/171
5,793,697 A * 8/1998 Sheuerlein ................ 365/230.7
6,034,887 A * 3/2000 Gupta et al. ................ 365/171
6,183,859 B1   2/2001 Chen et al. ................ 428/332
6,304,477 B1  10/2001 Naji ........................... 365/50

* cited by examiner

Primary Examiner—David Nelms
Assistant Examiner—David Nhu
(74) Attorney, Agent, or Firm—David C. Ripman; Matthew D. Rabdau; Scott C. Krieger

(57) ABSTRACT

An MRAM device includes a substrate; plural conductive lines, including a bit line and a word line; and a MTJ stack including a pair of magnetic yoke structures, wherein each of said yoke structures surrounds a conductive line. A method of fabricating a magnetic yoke in an MRAM structure includes preparing a substrate; forming a first conductive line on the substrate; fabricating a MTJ stack, including fabricating a first magnetic yoke structure about the first conductive line; forming a second conductive line on the MTJ stack; fabricating a second magnetic yoke about the second conductive line; depositing a layer of oxide on the structure; and metallizing the structure.

20 Claims, 7 Drawing Sheets

MAGNETIC YOKE STRUCTURES IN MRAM DEVICES TO REDUCE PROGRAMMING POWER CONSUMPTION AND A METHOD TO MAKE THE SAME

FIELD OF THE INVENTION

This invention relates to advanced non-volatile magnetic RAM (MRAM) devices, and specifically to a magnetic tunneling junction (MTJ) yoke structure for use in a MRAM device.

BACKGROUND OF THE INVENTION

Magnetic RAM has an advantage over convention RAM because of its non-volatility and fast data access. Of all the proposed MRAM structures, magnetic tunneling junction MRAM appears to be the first type of MRAM device to reach production. Motorola aims to sample 4-Mbit MRAM in 2003, eetimes, February 2001. A MTJ includes two ferromagnetic layers which are separated by an insulating tunnel barrier layer. The magnetoresistance (MR) effect is the result of spin-polarization tunneling of conductive electrons between the two ferromagnetic layers. The tunneling current is a factor of the relative orientation of magnetic moments in the two ferromagnetic layers. However, a significant disadvantage to the application of MRAM is the relatively large power consumption required during programming. The large power requirement is the result of the writing process, in which a programming current in the milli-ampere range is required in order to switch a free magnetic layer in the MRAM. Daughton, J. M., Magnetic tunneling applied to memory, J. Appl. Phys. 81(8) pp 3758–3763, April 1997. Data writing in MRAM devices is the result of the application of a magnetic field to a magnetic material, thereby magnetizing the material to one of two memory states. Reading is done by sensing a resistance charge in the magnetized material when a magnetic field is applied. Magnetic fields are created by a current passing through a line external to the magnetic material, as by passing a current through the magnetic material.

U.S. Pat. No. 5,640,343, to Gallagher et al., granted Jun. 17, 1997, for Magnetic memory array using magnetic tunnel junction devices in the memory cells, provides general background information on MTJ devices, and explains how the devices are written to and read from.

U.S. Pat. No. 6,183,859, to Chen et al., granted Feb. 6, 2001, for Low resistance MTJ, describes methods for fabricating a low resistance magnetic RAM.

U.S. Pat. No. 6,304,477, to Naji et al., granted Oct. 16, 2001, for Content addressable magnetic random access memory, describes an MRAM having differential tag program bit lines and a match line.

SUMMARY OF THE INVENTION

An MRAM device includes a substrate; plural conductive lines, including a bit line and a word line; and a MTJ stack including a pair of magnetic yoke structures, wherein each of said yoke structures surrounds a conductive line.

A method of fabricating a magnetic yoke in an MRAM structure includes preparing a substrate; forming a first conductive line on the substrate; fabricating a MTJ stack, including fabricating a first magnetic yoke structure about the first conductive line; forming a second conductive line on the MTJ stack; fabricating a second magnetic yoke about the second conductive line; depositing a layer of oxide on the structure; and metallizing the structure.

It is an object of the invention to provide a low power MRAM.

Another object of the invention is to provide a magnetic yoke structure for use in an MRAM.

This summary and objectives of the invention are provided to enable quick comprehension of the nature of the invention. A more thorough understanding of the invention may be obtained by reference to the following detailed description of the preferred embodiment of the invention in connection with the drawings.

DETAILED DESCRIPTION OF THE PREFERRED EMBODIMENTS

A magnetic yoke structure is used in the device of the invention, and a method to make the magnetic yoke structure is described. The programming current is then reduced by $1/\mu r$, where $\mu r$ is the magnetic permeability of the yoke. If the yoke material used is plated or sputtered NiFe, which has a $\mu r$ of about 1000, a reduction of programming current to the $\mu A$ range is achieved.

A basic magnetic tunneling junction MRAM element is composed of the following layers: an anti-ferromagnetic (AF) layer, a ferromagnetic (FM) pinned layer, an insulating tunneling gap layer, and a ferromagnetic free layer, which are formed into a magnetoresistance stack. Additionally, bottom and top conducting wires are provided to facilitate read and write functions.

Figure 1:
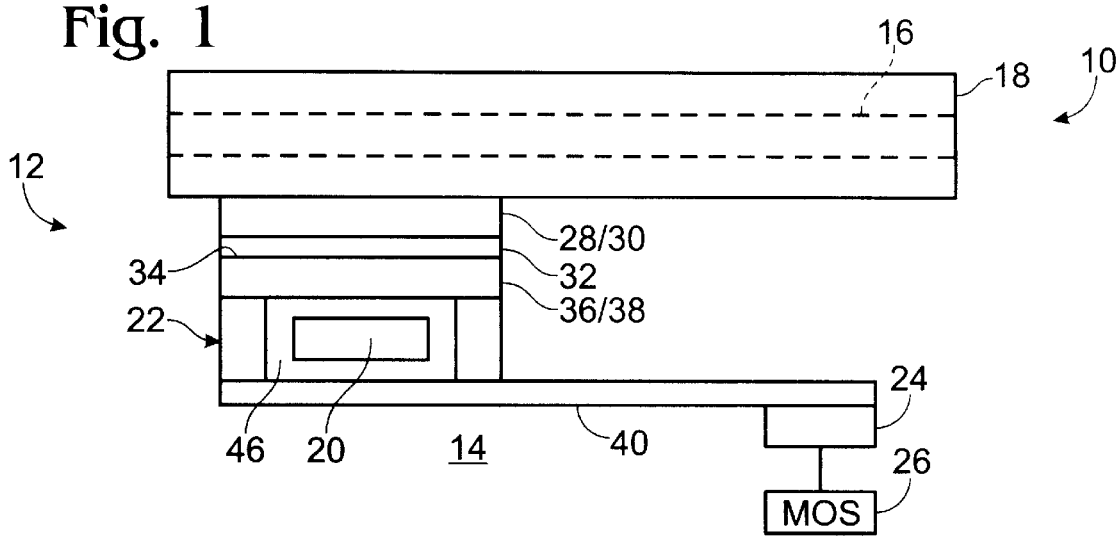
FIG. 1 depicts a MTJ MRAM element and related circuitry.

FIG. 1 illustrates a MRAM element 10, and a sandwich structure of a magnetic tunneling junction (MTJ) 12, and the related sensing circuitry, which are located on a substrate 14. As used herein, "substrate" includes a silicon substrate and any layers of conducting, semi-conducting and insulating material fabricated on a silicon substrate. Additionally, the substrate may have MOS transistors fabricated thereon as part of the substrate preparation. The general structure of FIG. 1 includes conducting lines, such as a bit line 16, encapsulated in a horse shoe shaped magnetic yoke 18, and a word line 20, also encapsulated in a horse shoe shaped magnetic yoke 22, and a via 24, connected to a MOS transistor 26. MTJ 12 includes an AF pinned layer 28, an FM pinned layer 30, an insulating gap 32, a tunnel barrier layer 34, FM free layers 36, 38, and a bottom electrode 40. A seed layer and a capping layer are described later herein. Table 1 enumerates a set of parameters for each layer.

TABLE 1

| MTJ Components | |
|---|---|
| Seed Layer | Ta, 7 nm thick |
| Bottom Electrode | NiFe (30 nm); Al (25 nm) + NiFe (4 nm) |
| Exchange Pinning | Antiferromagnetic (AF) $Mn_{54}Fe_{46}$ (8–10 nm) or IrMn |

TABLE 1-continued

MTJ Components

| | |
|---|---|
| FM Pinned Layer | $Co_{84}Fe_{16}$ (3 nm); $Co_{40}Fe_{60}$; $Ni_{60}Fe_{40}$ or Co (4nm)/Ru (7nm)/Co (4nm) |
| Tunnel Barrier | Al (0.7~1.0 nm) + plasma oxidation, or ALD $Al_2O_3$; Critical |
| FM Free Layer | CoFe (3 nm) |
| FM Free Layer | NiFe (7 nm) |
| Capping Layer | Ta (3–10 nm); or Al |

Word line (WL) 20 is surrounded by soft magnetic material of magnetic yoke structure 42, which has a magnetic permeability of about 1000. Calculations indicates that, with the surrounding yoke structure, the programming current may be reduced to the μA range, and generates a 20 Oe programming field in the magnetic free layer, assuming layer thicknesses as given in Table 1. The programming current is about 4 mA, for the same structure, if no magnetic yoke is present.

Figure 2:
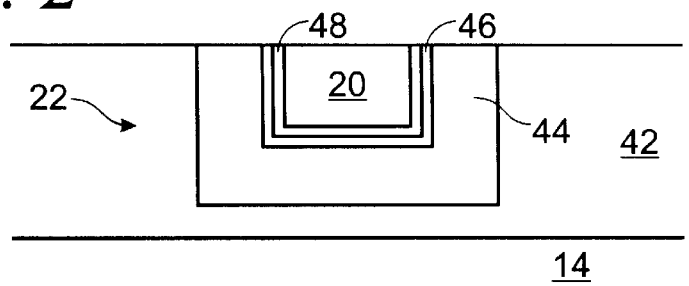
FIGS. 2 and 3 depicts the yoke structure for a MTJ MRAM according to the invention.
Figure 3:
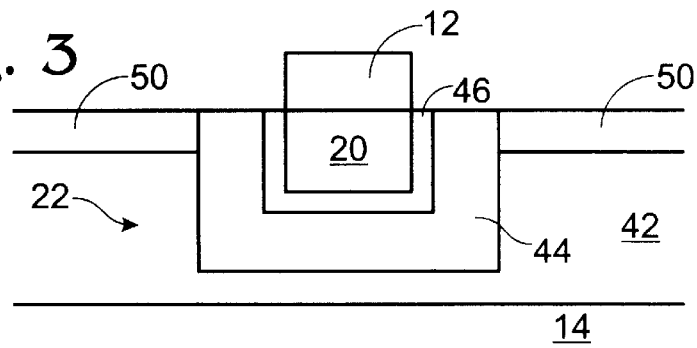

Referring now to FIG. 2, the construction of the first magnetic yoke of the invention will be described. A silicon substrate 14 may be either n-type of p-type silicon. A layer of silicon dioxide 42 is deposited onto substrate 14 to a thickness of between about 500 nm to 1000 nm. Oxide layer 42 is etched to form a trench, having a depth of between about 400 nm to 900 nm, depending on the oxide layer thickness, but leaving about 100 nm of oxide on the substrate. A layer 44 of NiFe is deposited by sputtering to a thickness of about 200 nm. Another layer of silicon dioxide 46 is deposited by CVD, followed by deposition of a copper barrier layer 48, which may be TiN or WN, and a conductive line of copper 20 is deposited on oxide layer 46. The structure is smoothed by CMP to remove excess copper and to etch copper barrier layer 48. The structure is patterned and partially covered with photoresist to cover conductive line 20. The NiFe layer is removed by an ion milling etching process. The exposed surfaces are covered with silicon dioxide layer 50, after which the structure is smoothed by CMP to expose the conductive line. A MTJ stack 12 is then formed on conductive line 20.

Figure 4:
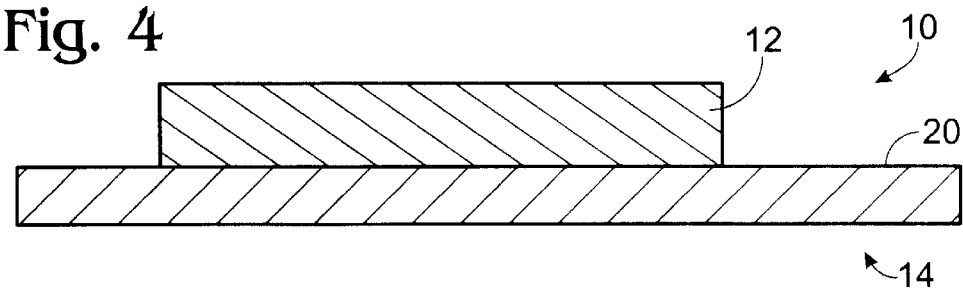
FIGS. 4–13 depict successive steps in the preferred embodiment of the method of the invention.

FIGS. 4–13 depicts successive steps in the fabrication of a magnetic yoke for use in an MRAM according to the invention in greater detail. FIG. 4 depicts silicon substrate 14, which may have one or more MOS transistors formed thereon. Word line (WL) 20 is formed as previously described and encapsulated in first magnetic yoke 18. WL, referred to herein as a first conductive line, may be formed of a suitable metal, such as aluminum, copper, or platinum, although copper is preferred, to a thickness of between about 400 nm to 900 nm. MTJ stack 12 is fabricated on WL 20 in this embodiment of the invention, and contains the layers of materials listed in Table 1, deposited to the thicknesses listed in Table 1.

Figure 5:
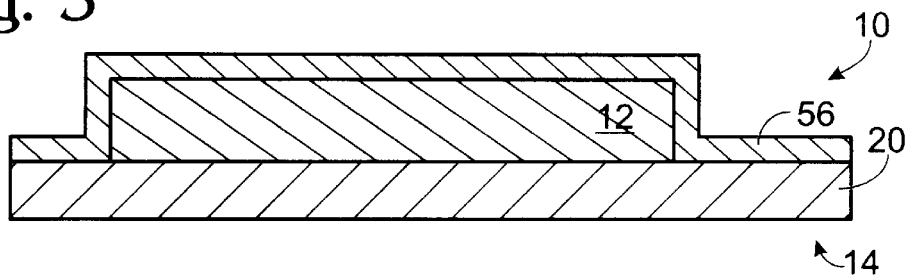

FIG. 5, the WL and MTJ stack are covered by a layer of oxide 56, deposited by CVD to a thickness of between about 50 nm to 100 nm.

Figure 6:
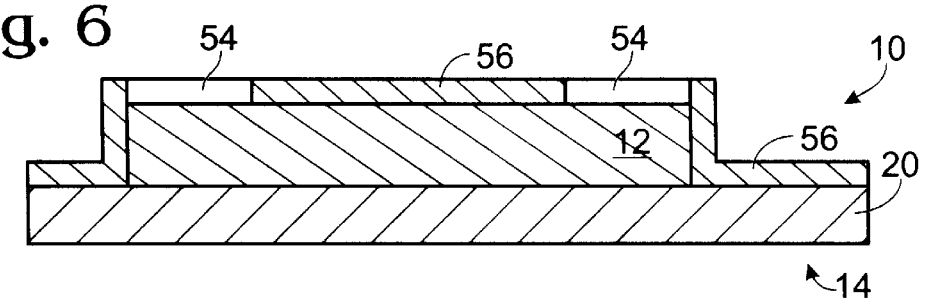

FIG. 6 the oxide layer is patterned and etched to expose portions of the MTJ stack.

Figure 7:
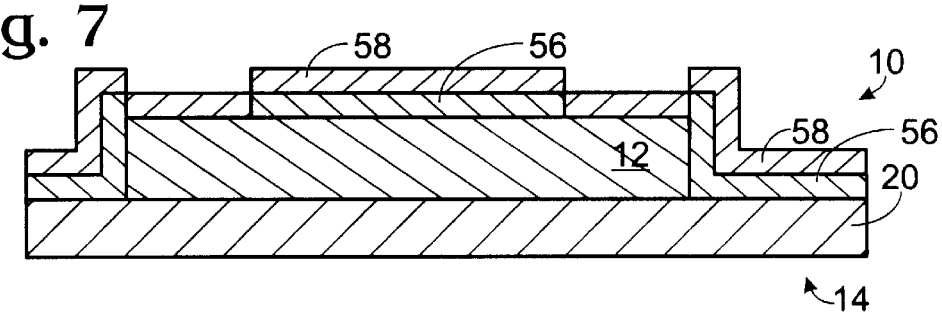

FIG. 7 a layer of NiFe 58 is deposited over the structure to a thickness of about 100 nm. This layer provides a seed layer for subsequent yoke plating.

Figure 8:
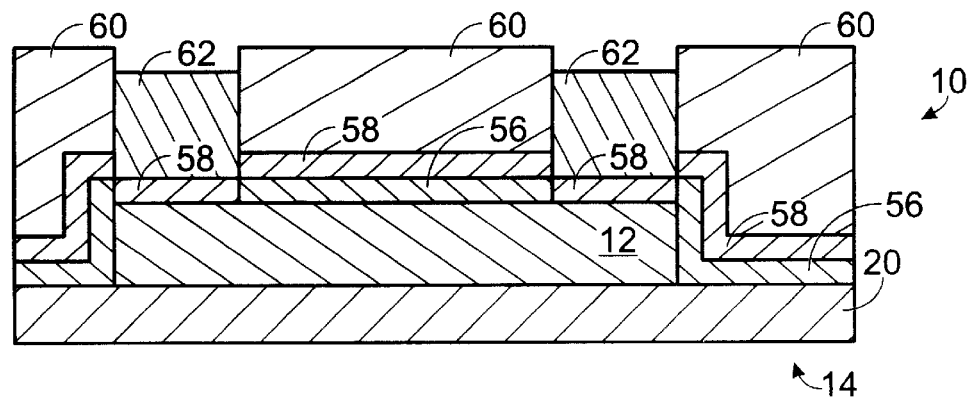

FIG. 8 photoresist 60 is applied and another layer of NiFe 62 is deposited providing for a total NiFe thickness of about 1000 nm.

Figure 9:
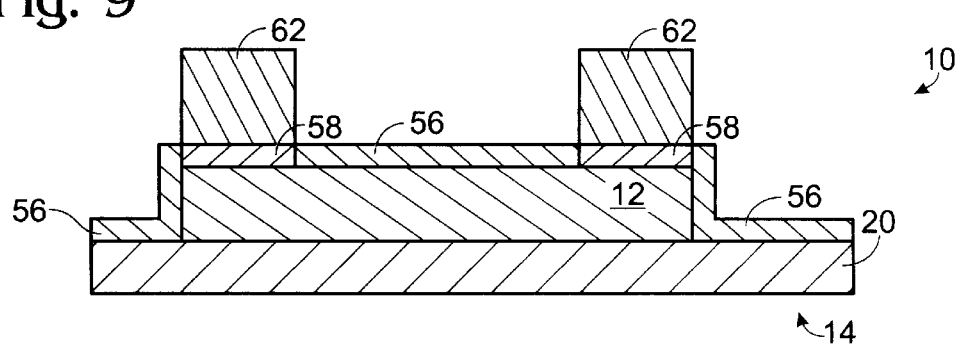

FIG. 9 the photoresist is stripped and the NiFe is ion milled to remove the NiFe overlaying the oxide, leaving the thicker NiFe layer over those portions of the structure which had the oxide previously removed.

Figure 10:
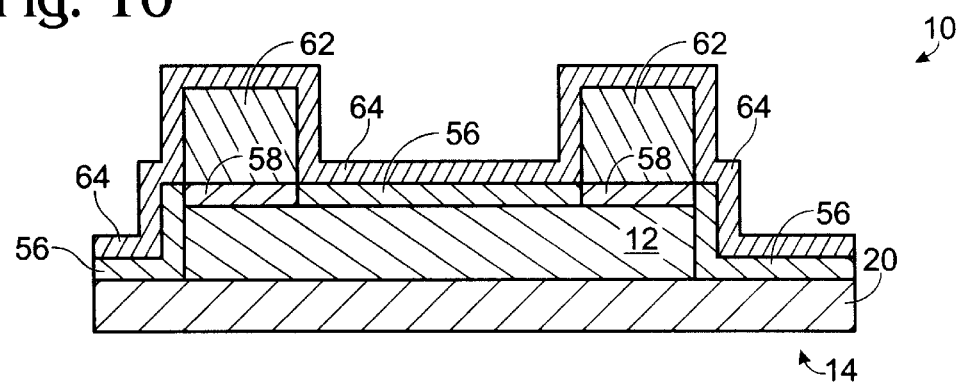

FIG. 10 a layer of oxide 64 is deposited by CVD to a thickness of between about 50 nm to 100 nm, completely covering the structure.

Figure 11:
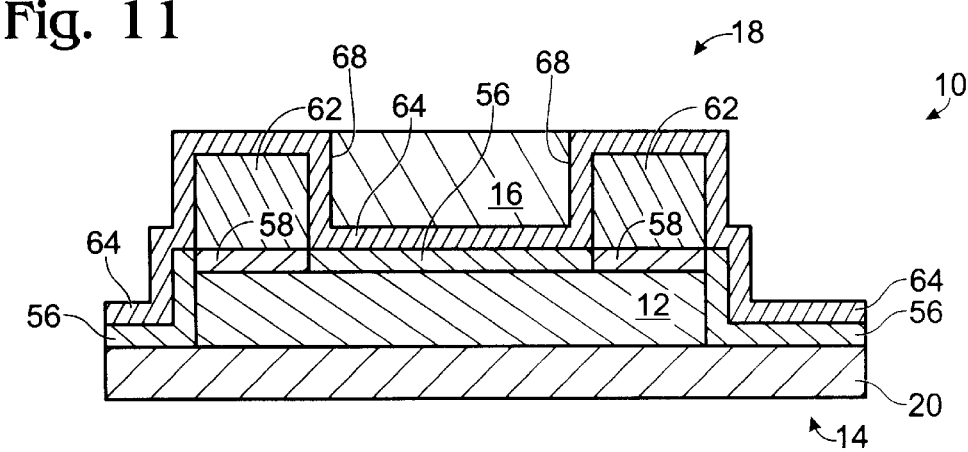

FIG. 11 a metal barrier layer 66 is formed in a bit line trench 68, and the bit line trench filled with a metal, such as copper, to form bit line (BL) 16, referred to herein as a second conductive line. The structure is polished by chemical mechanical polishing (CMP).

Figure 12:
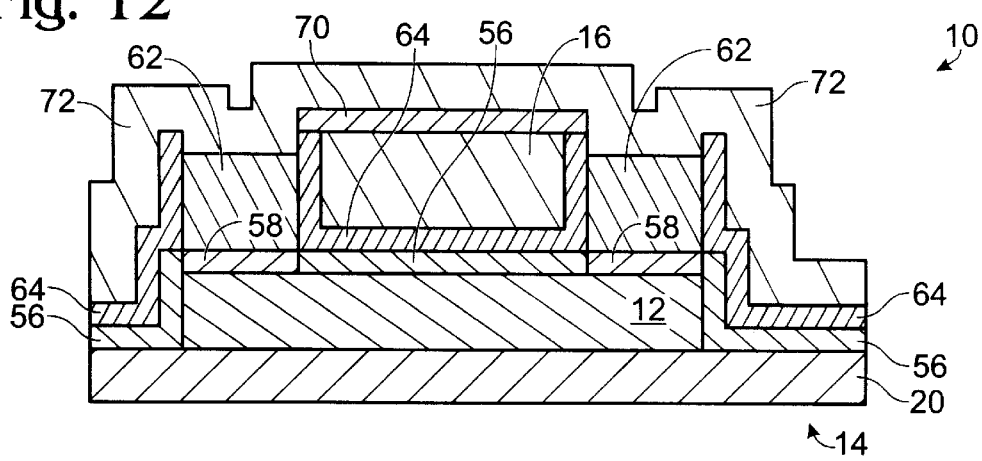

FIG. 12 a layer of oxide 70 is deposited over the structure to a thickness of about 100 nm. The oxide is masked and etched, to open the top of the NiFe layer magnetic contact. Another layer of NiFe 72 is deposited to a thickness of about 200 nm. NiFe elements 62 and 72 form an encapsulating structure 18 for BL 16, which has a horse shoe configuration, as does encapsulating structure 22.

Figure 13:
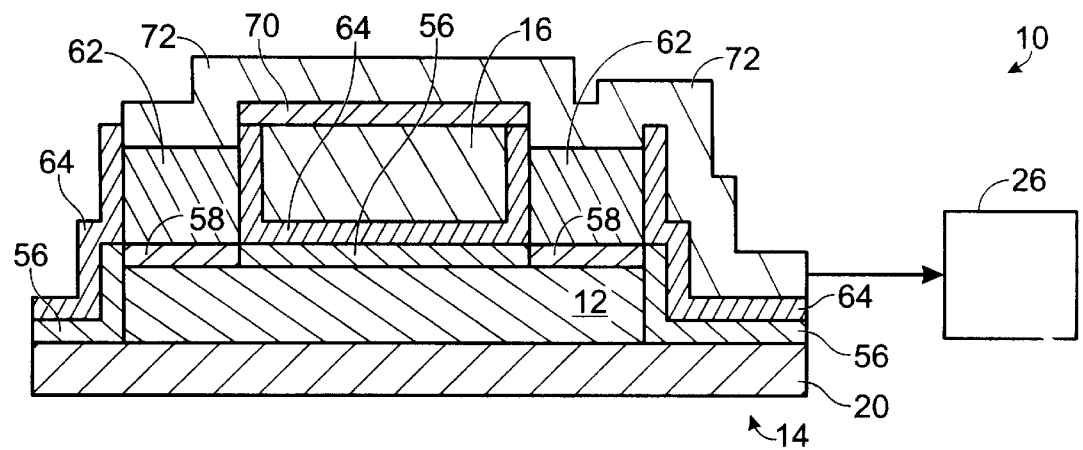

FIG. 13 the structure is patterned, and the NiFe is removed by ion milling on the left side of the figure. The NiFe material on the right side of the figure is connecter to transistor 26. The structure is completed and finished by appropriate metallization. The BL and WL may be interchanged, i.e., the BL may be formed as the second conductive line and the WL may be formed as the first conductive line, therefore, the fabrication process for these structures and their magnetic yoke structures may also be interchanged.

Figure 14:
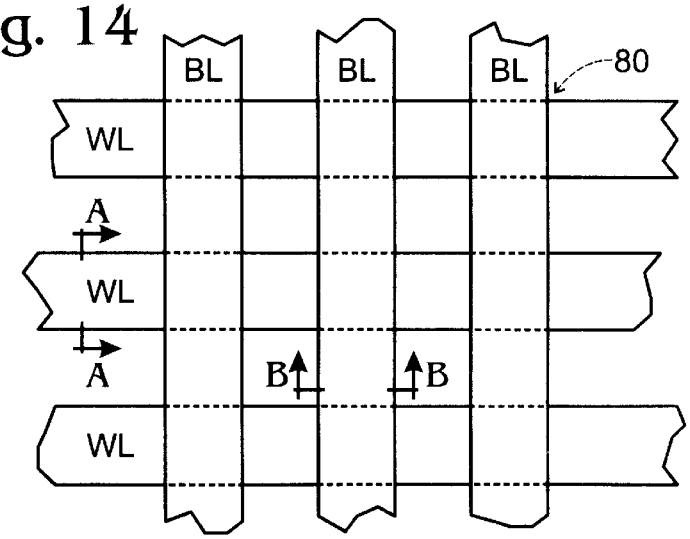
FIG. 14 depicts an MRAM array constructed according to the invention.
Figure 15:
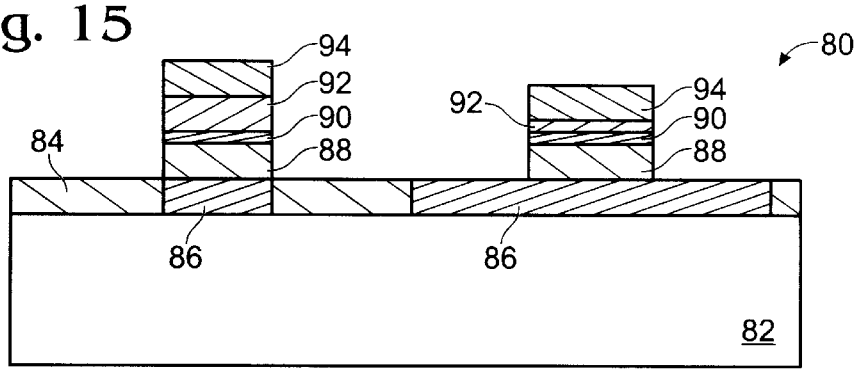
FIGS. 15–21 depict successive steps in an alternate embodiment of the invention.
Figure 16:
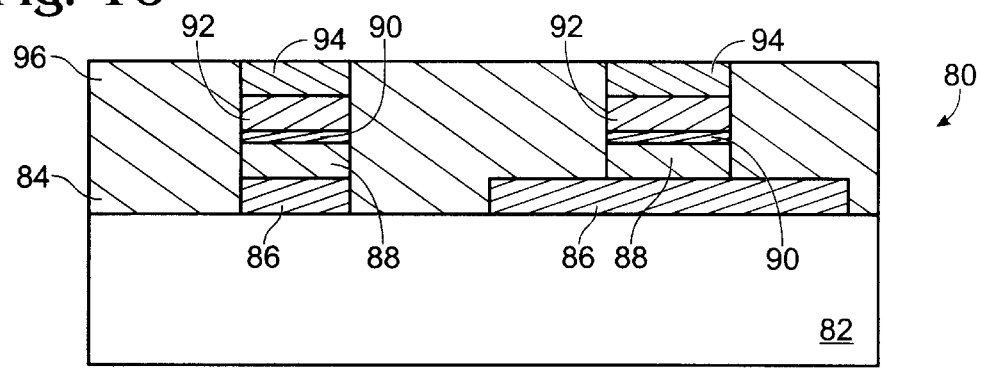
Figure 17:
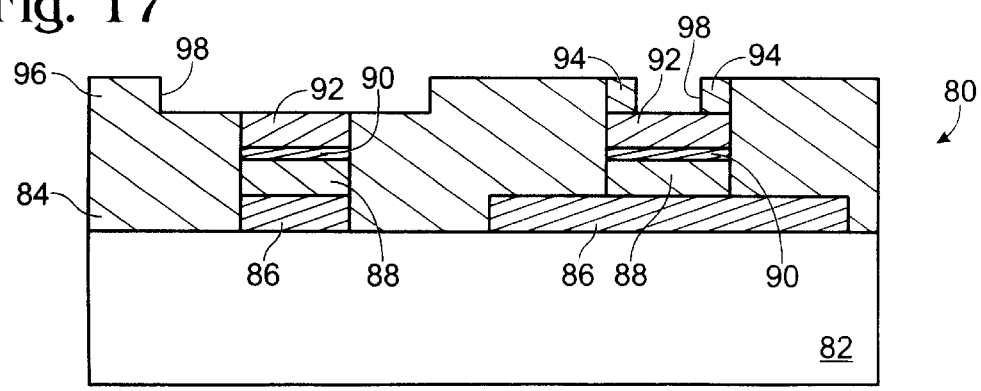

An alternate method of fabricate an MRAM according to the method of the invention is described in conjunction with FIGS. 14–21. Turning to FIG. 14, the structure is depicted in a top plan view, showing the orientation of the remaining FIGS. 14–20. In each of FIGS. 15 to 21, the left side of the figure is a cross-section taken parallel to the BL, view A—A, while the right side of the figure is a cross-section taken parallel to the WL, view B—B. Again, the first step in fabricating a magnetic yoke structure 80 according to the invention is preparing a substrate 82. The substrate may be a silicon wafer of either n-type or p-type, with MOS transistors fabricated thereon. As shown in FIG. 15, an oxide layer 84 is formed on the substrate to a thickness of between about 500 nm to 1000 nm. The oxide is patterned and etched by a dual damascene process, and metal for a WL 86 is deposited, as by CVD or PVD. The metal deposited may be aluminum, copper or platinum. A fixed magnetic layer stack 88 of Ta, NiMn, CoFe; Ta, FeMn, CoFe: or Ta, NiFe, FeMn, CoFe is deposited to a thickness of between about 45 nm to 55 nm and a layer 90 of $Al_xO_y$ is deposited to a thickness of between about one nm to two nm form a tunnel barrier layer. A free magnetic layer 92 of NiFe is then deposited to a thickness of between about seven nm to twelve nm, followed by a layer of silicon nitride 94, which is deposited to a thickness of between about 500 nm to 1000 nm. The structure is patterned and etched, resulting in the memory stack structure of FIG. 15.

A layer of oxide 96 is deposited to a thickness of between about 800 nm and 1400 nm. The structure is smoothed by CMP, resulting in the structure of FIG. 16. The structure is covered with photoresist and appropriate vias and trenches are formed to a depth of between about 500 nm and 1000 nm, by a dual damascene process to form BL trenches 98. Oxide 96 is then etched, as is nitride 94, resulting in the structure of FIG. 17.

Figure 18:
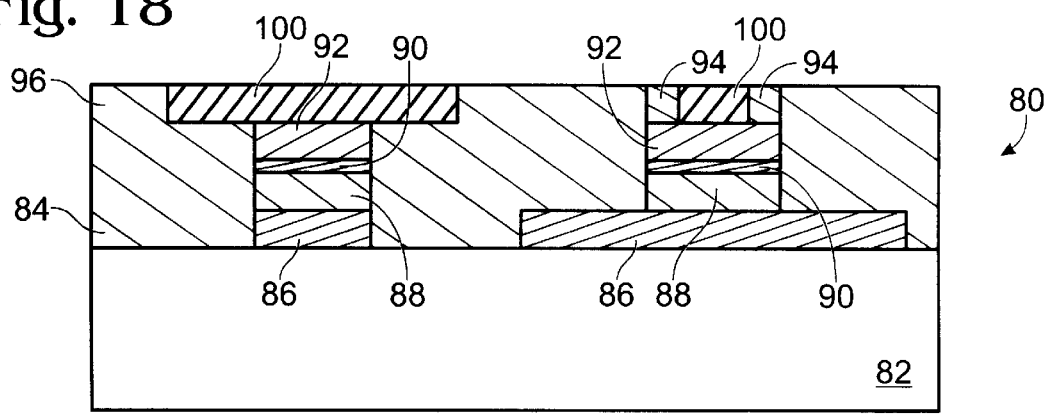
Figure 19:
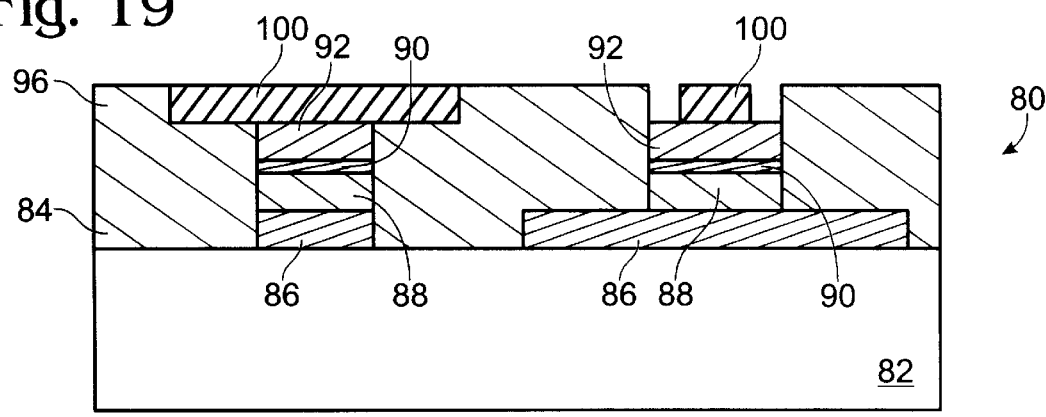
Figure 20:
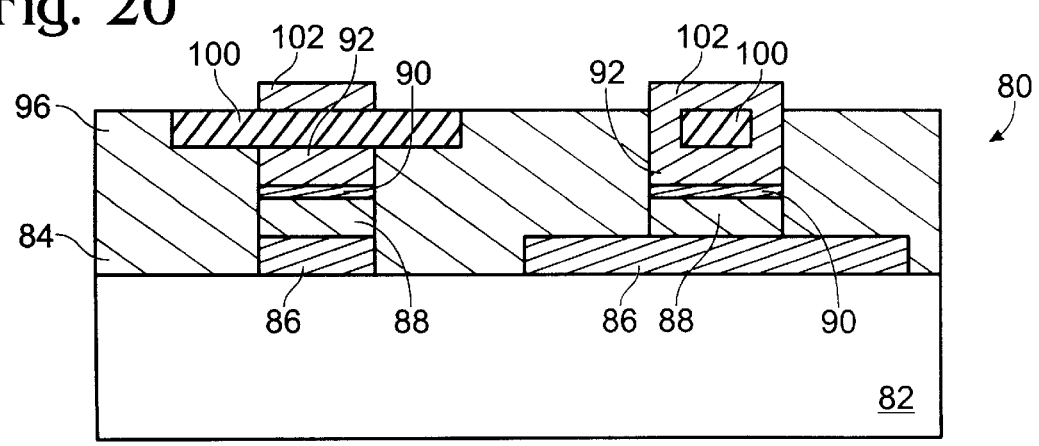

Turning to FIG. 18, copper is deposited by CVD into the BL trenches, forming BL 100, and finished by CMP. Nitride 94 is removed by a wet etch process, resulting in the structure of FIG. 19. A second free magnetic layer 102 is deposited to a thickness of between about 500 nm to 1000 nm, overlying the BL, and filling the trenches left by the nitride removal. Portions of the second free magnetic layer are covered with photoresist, and the remainder removed by etching, leaving the structure of FIG. 20.

Figure 21:
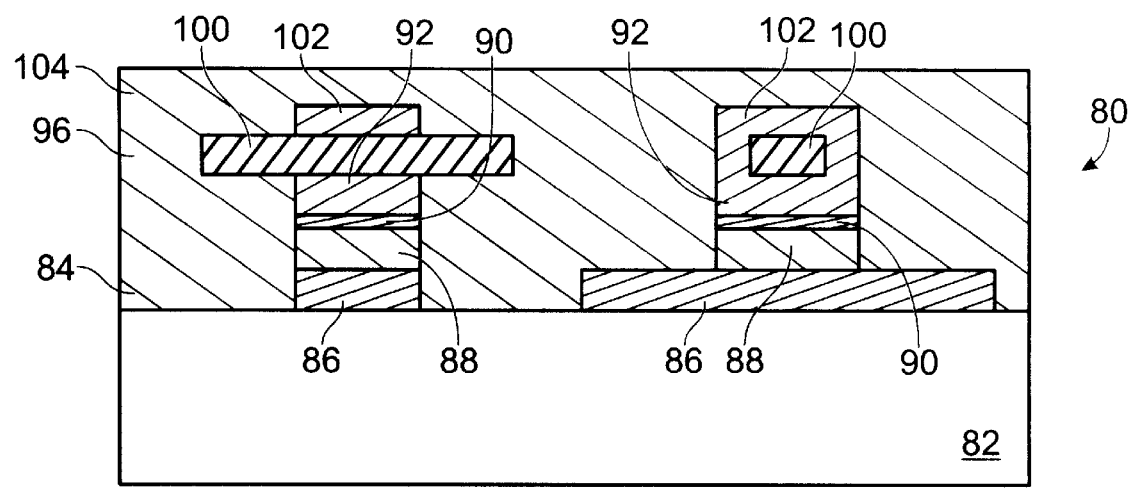

Referring to FIG. 21, a layer of oxide 104 is deposited to a thickness of between about 1000 nm and 2000 nm, passivated, and the structure metallized (not shown), completing the magnetic yoke structure of the invention. The structure may be inverted, i.e., the BL may be on the bottom of the MR stack and the WL may be on the top of the stack.

Thus, a magnetic yoke structures has been disclosed which may be used in MRAM devices to reduce programming power consumption, as has a method of making the magnetic yoke structure of the invention. It will be appreciated that further variations and modifications thereof may be made within the scope of the invention as defined in the appended claims.

We claim:

1. An MRAM device comprising:
   a substrate;
   plural conductive lines, including a bit line and a word line; and
   a MTJ stack including a pair of magnetic yoke structures, wherein each of said yoke structures surrounds a conductive line.

2. The MRAM of claim 1 wherein said yoke structures have horse shoe configurations.

3. The MRAM of claim 1 wherein said substrate includes a MOS transistor connected to one of said conductive lines.

4. The MRAM of claim 1 wherein said MTJ stack includes an AF pinned layer, an FM pinned layer, an insulating gap, a tunnel barrier layer, two FM free layers, bottom electrode, a seed layer and a capping layer.

5. The MRAM of claim 1 wherein said yoke structure includes, seriatim, an oxide layer, a NiFe layer, and an oxide layer surrounding an associated conductive line.

6. The MRAM of claim 5 wherein said yoke structure includes a copper barrier layer located between said NiFe layer and said conductive line, and wherein said copper barrier layer is taken from the group of material consisting of TiN and WN.

7. The MRAM of claim 1 wherein said substrate includes a MOS transistor, and wherein a first conductive line is formed on the substrate and is surrounded by an encapsulating magnetic yoke; and wherein said MTJ includes a fixed magnetic layer taken from the group of magnetic layers consisting of Ta, NiMn, CoFe; Ta, FeMn, CoFe; and Ta, NiFe, FeMn, CoFe; wherein said MTJ further includes a tunnel barrier layer and a free magnetic layer.

8. The MRAM of claim 7 wherein said free magnetic layer is taken from the group of magnetic layers consisting of NiFe and CoFe.

9. The MRAM of claim 1 wherein the programming current required for the MRAM is in the $\mu$A range.

10. An MRAM device comprising:
    a substrate, including a MOS transistor formed thereon;
    plural conductive lines, including a bit line and a word line, wherein said MOS transistor is connected to one of said conductive lines; and
    a MTJ stack including a pair of magnetic yoke structures, wherein each of said yoke structures surrounds a conductive line;
    wherein a first conductive line is formed on the substrate and is surrounded by an encapsulating magnetic yoke; and wherein said MTJ includes a fixed magnetic layer taken from the group of magnetic layers consisting of Ta, NiMn, CoFe; Ta, FeMn, CoFe; and Ta, NiFe, FeMn, CoFe; wherein said MTJ further includes a tunnel barrier layer and a free magnetic layer.

11. The MRAM of claim 10 wherein said yoke structures have horse shoe configurations, and include, seriatim, an oxide layer, a NiFe layer, and an oxide layer surrounding an associated conductive line, and wherein a copper barrier layer taken from the group of material consisting of TiN and WN is located between said NiFe layer and said conductive line.

12. The MRAM of claim 10 wherein said MTJ stack includes an AF pinned layer, an FM pinned layer, an insulating gap, a tunnel barrier layer, two FM free layers, bottom electrode, a seed layer and a capping layer.

13. The MRAM of claim 10 wherein said free magnetic layer is taken from the group of magnetic layers consisting of NiFe and CoFe.

14. The MRAM of claim 10 wherein the programming current required for the MRAM is in the $\mu$A range.

15. An MRAM device comprising:
    a substrate,
    plural conductive lines, including a bit line and a word line;
    a MOS transistor located on said substrate and connected to one of said conductive lines;
    a MTJ stack including a pair of magnetic yoke structures having horse shoe configurations, wherein each of said yoke structures surrounds a conductive line;
    wherein the programming current required for the MRAM is in the $\mu$A range.

16. The MRAM of claim 15 wherein said MTJ stack includes an AF pinned layer, an FM pinned layer, an insulating gap, a tunnel barrier layer, two FM free layers, bottom electrode, a seed layer and a capping layer.

17. The MRAM of claim 15 wherein said yoke structure includes, seriatim, an oxide layer, a NiFe layer, and an oxide layer surrounding an associated conductive line.

18. The MRAM of claim 17 wherein said yoke structure includes a copper barrier layer located between said NiFe layer and said conductive line, and wherein said copper barrier layer is taken from the group of material consisting of TiN and WN.

19. The MRAM of claim 15 wherein a first conductive line is formed on the substrate and is surrounded by an encapsulating magnetic yoke; and wherein said MTJ includes a fixed magnetic layer taken from the group of magnetic layers consisting of Ta, NiMn, CoFe, Ta, FeMn, CoFe; and Ta, NiFe, FeMn, CoFe; wherein said MTJ further includes a tunnel barrier layer and a free magnetic layer.

20. The MRAM of claim 15 wherein said free magnetic layer is taken from the group of magnetic layers consisting of NiFe and CoFe.

* * * * *